(12) United States Patent
Adrian et al.

(10) Patent No.: US 10,765,036 B2
(45) Date of Patent: Sep. 1, 2020

(54) SYSTEMS AND DEVICES FOR LOW-VIBRATION COOLING OF STORAGE DRIVES

(71) Applicant: Facebook, Inc., Menlo Park, CA (US)

(72) Inventors: Jason David Adrian, San Jose, CA (US); Austin Joel Cousineau, Menlo Park, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/853,278

(22) Filed: Dec. 22, 2017

(65) Prior Publication Data

US 2019/0200486 A1    Jun. 27, 2019

(51) Int. Cl.
| | |
|---|---|
| H05K 5/00 | (2006.01) |
| H05K 7/20 | (2006.01) |
| H05K 7/18 | (2006.01) |
| H05K 5/02 | (2006.01) |
| G11B 33/08 | (2006.01) |
| G11B 33/12 | (2006.01) |
| G11B 33/14 | (2006.01) |

(52) U.S. Cl.
CPC ......... *H05K 7/20709* (2013.01); *G11B 33/08* (2013.01); *G11B 33/128* (2013.01); *G11B 33/1413* (2013.01); *H05K 5/0021* (2013.01); *H05K 5/0256* (2013.01); *H05K 7/183* (2013.01); *H05K 7/2039* (2013.01)

(58) Field of Classification Search
CPC ....................................................... H05K 7/00
See application file for complete search history.

(56) References Cited

U.S. PATENT DOCUMENTS

| | | | |
|---|---|---|---|
| 6,333,849 B1* | 12/2001 | Donahoe | G06F 1/203 361/679.47 |
| 2004/0169956 A1* | 9/2004 | Oba | G06F 1/20 360/97.15 |
| 2011/0083825 A1* | 4/2011 | Merrow | G05D 23/1934 165/80.2 |
| 2012/0017564 A1* | 1/2012 | Dhingra | F02C 7/047 60/39.093 |
| 2017/0177041 A1* | 6/2017 | Shelnutt | G06F 1/20 |

* cited by examiner

*Primary Examiner* — Jerry Wu
(74) *Attorney, Agent, or Firm* — FisherBroyles, LLP

(57) ABSTRACT

A disclosed apparatus may include a storage drawer chassis having thermally-conductive barriers, with the thermally-conductive barriers defining storage bays adapted to receive storage drives. The apparatus may further include a coolant manifold, an inlet mechanism adapted to receive coolant into the coolant manifold of the storage drawer chassis, and an outlet mechanism adapted to permit coolant to exit the storage drawer chassis for thermal processing. The coolant manifold may be disposed in the storage drawer chassis to distribute coolant among a plurality of coolant channels extending within the thermally-conductive barriers to cool the storage drives. Other related systems, devices and methods are disclosed.

18 Claims, 17 Drawing Sheets

SYSTEMS AND DEVICES FOR LOW-VIBRATION COOLING OF STORAGE DRIVES

BACKGROUND

The first computer hard drive ever shipped had a capacity of less than five megabytes. Now, thousands and thousands of gigabytes of data are being generated every day. Everything from text to pictures to videos is being stored to storage drives, often remotely via the cloud. A website or service that allows users to upload media must store vast amounts of data. This storage burden is further increased by the fact that many organizations create and store duplicate copies of code and data for disaster-recovery, testing, regulatory, or other purposes. Some organizations outsource this responsibility while other organizations manage their own data centers full of servers and storage drives.

The density at which storage drives can store information has increased over the years. New technologies such as heat-assisted magnetic recording (HAMR) and microwave assistance magnetic record (MAMR), for example, will help make reading and writing to a smaller area easier. However, when large numbers of disk-based storage drives are grouped together to allow for the storage of massive amounts of data in a data center, the heat naturally increases. This heat can decrease or limit the performance of the storage drives. Conventional approaches, such as blowing fans, for air cooling may work to maintain suitable operating temperatures, but can introduce high-frequency noise or vibrations that can decrease or limit the performance of the storage drives by degrading the precision with which the drives can read and write data. Accordingly, conventional approaches to heat mitigation for large groups of disk-based storage drives have not been entirely satisfactory.

SUMMARY

As will be described in greater detail below, the instant disclosure describes heat-mitigation systems to remove heat produced by the operation of storage drives in a way that avoids or lessens the introduction of high-frequency noise and associated motion, by circulating a coolant through the drive chassis that holds the storage drives.

In one example, an apparatus may include a storage drawer chassis having several thermally-conductive barriers. Pairs of the thermally-conductive barriers may define storage bays adapted to receive one or more storage drives. The apparatus may also include a coolant manifold, disposed in a back end of the storage drawer chassis to distribute coolant among a plurality of coolant channels that extend within the thermally-conductive barriers to cool the one or more storage drives. The apparatus may also include an inlet mechanism adapted to receive coolant into the coolant manifold. The apparatus may also include an outlet mechanism adapted to permit coolant to exit the storage drawer chassis for thermal processing.

In some implementations, the apparatus may further include a plurality of slot guides extending within the storage bays and defining slots sized to receive storage drives. The apparatus may also include a barrier pivot that secures at least one of the thermally-conductive barriers to the storage drawer chassis, while permitting the at least one thermally-conductive barrier to rotate upon insertion of a storage drive to increase contact between the at least one thermally-conductive barrier and a sidewall of the storage drive. Sidewalls of the storage bays may include one or more ramp surfaces to increase heat-transmissive contact with received storage drives.

In some implementations, the apparatus may further include one or more hard-disk-based storage drives inserted into one or more slots defined within the storage bays. At least one of the hard-disk-based storage drives may include a storage drive housing, a hard disk, a disk controller, and a heat exchanger. The heat exchanger may include a heat pipe extending longitudinally within the storage drive housing such that the heat pipe may be positioned proximate a wall of one of the thermally-conductive barriers. The heat exchanger may include an additional heat pipe extending longitudinally within the storage along an opposing wall of the first storage bay. The storage drawer chassis may have a rail system configured to attach to a rack chassis in a sliding connection such that the storage drawer chassis is displaceable relative to the chassis to permit access to the storage bays.

In another example, a storage media heat-mitigation system may include a rack chassis configured to receive a plurality of storage drawer chasses and at least one storage drawer chassis removably inserted into the rack chassis. The storage drawer chassis may include a plurality of thermally-conductive barriers defining storage bays adapted to receive one or more storage drives, with at least one coolant channel extending along at least one thermally-conductive barrier. The storage media heat-mitigation system may also include an inlet mechanism to receive coolant into the coolant channel of the storage drawer chassis and an outlet mechanism to permit coolant to exit the storage drawer chassis for processing. The storage media heat-mitigation system may also include a coolant processing unit coupled to the inlet mechanism and outlet mechanism to process the coolant, at least in part, by circulating the coolant through the coolant channel.

In some implementations, the storage media heat-mitigation system may further include a coolant manifold disposed in a back end of the storage drawer chassis. The coolant manifold may distribute coolant among a plurality of channels extending within the thermally-conductive barriers. The storage media heat-mitigation system may further include a system manifold external to the storage drawer chassis, coupled to the coolant processing unit, where the system manifold includes a plurality of inlet and outlet connections to couple the coolant processing unit to a plurality of storage drawer chasses. The storage media heat-mitigation system may further include a rack manifold, coupled to the rack chassis, that includes a plurality of inlet and outlet connections to couple the coolant processing unit to a plurality of storage drawer chasses. The thermally-conductive barriers may extend within the storage drawer chassis in a direction orthogonal to an insertion axis of the storage drawer chassis within the rack chassis. Coolant channels extending along the thermally-conductive barriers may form a serpentine path within one of the thermally-conductive barriers.

In another example, an apparatus may include a hard disk for storing data and a storage drive housing that encloses the hard disk. The storage drive housing may include a top side and a bottom side disposed opposite the top side, with the top side and bottom side extending substantially parallel to the hard disk and a sidewall portion extending between the top side and the bottom side. The apparatus may also include a controller that controls reading and writing to the hard disk. The apparatus may also include a heat exchanger with a heat pipe extending longitudinally within the storage drive housing, such that the heat pipe is positioned proximate the sidewall portion of the storage drive housing to enable transmission of heat through the sidewall portion.

In some implementations, the sidewall portion may include one or more bumps to increase heat-transmissive contact with a storage bay defined by thermally-conductive barriers of a storage drawer chassis when the apparatus is inserted into a storage drawer chassis. The heat exchanger may further include an additional heat pipe extending longitudinally within the storage drive such that the additional heat pipe is positioned proximate an opposing sidewall of the storage drive housing. A material of the sidewall of the storage drive housing may be more thermally-conductive than the top side and the bottom side of the storage drive housing.

In another example, a method of operating such apparatuses and systems in provided. The method may include connecting a storage drawer chassis to a coolant processing system. Flexible hoses may also be connected directly or indirectly between the drawer chassis and the coolant processing unit. The method may further include circulating a coolant through coolant channels extending within the drawer chassis to cool one or more storage drives.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate several exemplary embodiments and are a part of the specification. Together with the following description, these drawings demonstrate and explain various principles of the present disclosure.

Figure 1:
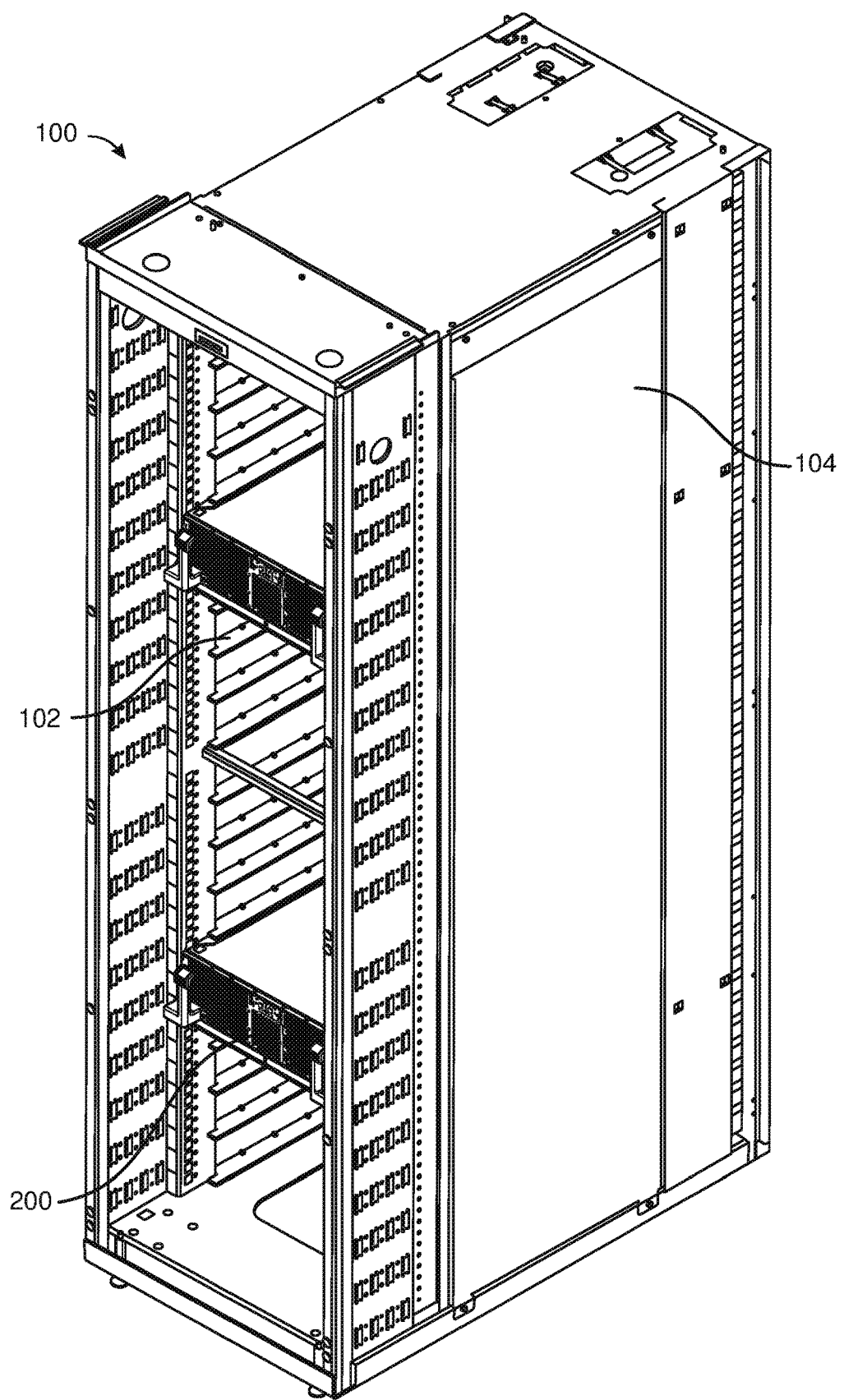
FIG. 1 is a perspective view of a rack chassis configured to hold one or more storage drawer chasses, according to some aspects of the present disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to systems and devices for mitigating heat produced by storage drives while minimizing vibrations, such as those produced by air cooling fans. As will be explained in greater detail below, embodiments of the instant disclosure may include an apparatus that has a storage drawer chassis with multiple thermally-conductive barriers, a coolant manifold, and inlet and outlet mechanisms. Pairs of the thermally-conductive barriers may define storage bays adapted to receive one or more storage drives. The sidewalk of the one or more storage drives may transfer heat from the storage drives to the thermally-conductive barriers by direct contact. The coolant manifold may be disposed in a back end of the storage drawer chassis and may distribute coolant among a plurality of coolant channels extending within the thermally-conductive barriers to remove the heat from the thermally-conductive barriers. The inlet mechanism may receive coolant into the coolant manifold of the storage drawer chassis, while the outlet mechanism may to permit coolant to exit the storage drawer chassis for thermal processing away from the one or more storage drives and the storage drawer chassis.

Embodiments of the present disclosure may overcome certain problems with the conventional fan-based approaches. In particular, embodiments of the present disclosure may decrease or eliminate the vibrations to which the storage drives may be exposed by the oscillations of fans and by the turbulence produced when air blows across the storage drives. The vibrations that result from conventional cooling approaches can induce significant high-frequency variations in the positioning of the read-write head, disposed at the end of an arm, used to read from and write to a hard disk or platter of a storage drive. The circulation of a coolant, which may be a liquid or a gas, through the systems and devices described herein may mitigate heat while only subjecting the storage drives to lower-frequency vibrations, permitting the read-write head to be positioned with more precision. The compensation mechanisms included in some storage drives may be better able to compensate for lower-frequency vibrations that for higher-frequency vibrations. Accordingly, by reducing the high-frequency vibrations, the tolerances required between lines of information recorded on the platter may be reduced and the data storage density may be increased, permitting more data to be stored on a given amount of physical space.

The following will provide, with reference to FIGS. 1-6B and 7, detailed descriptions of embodiments of the present disclosure that provide for low-vibration cooling of storage drives that may increase the reliability of hard drives to store data at higher densities.

Figure 2:
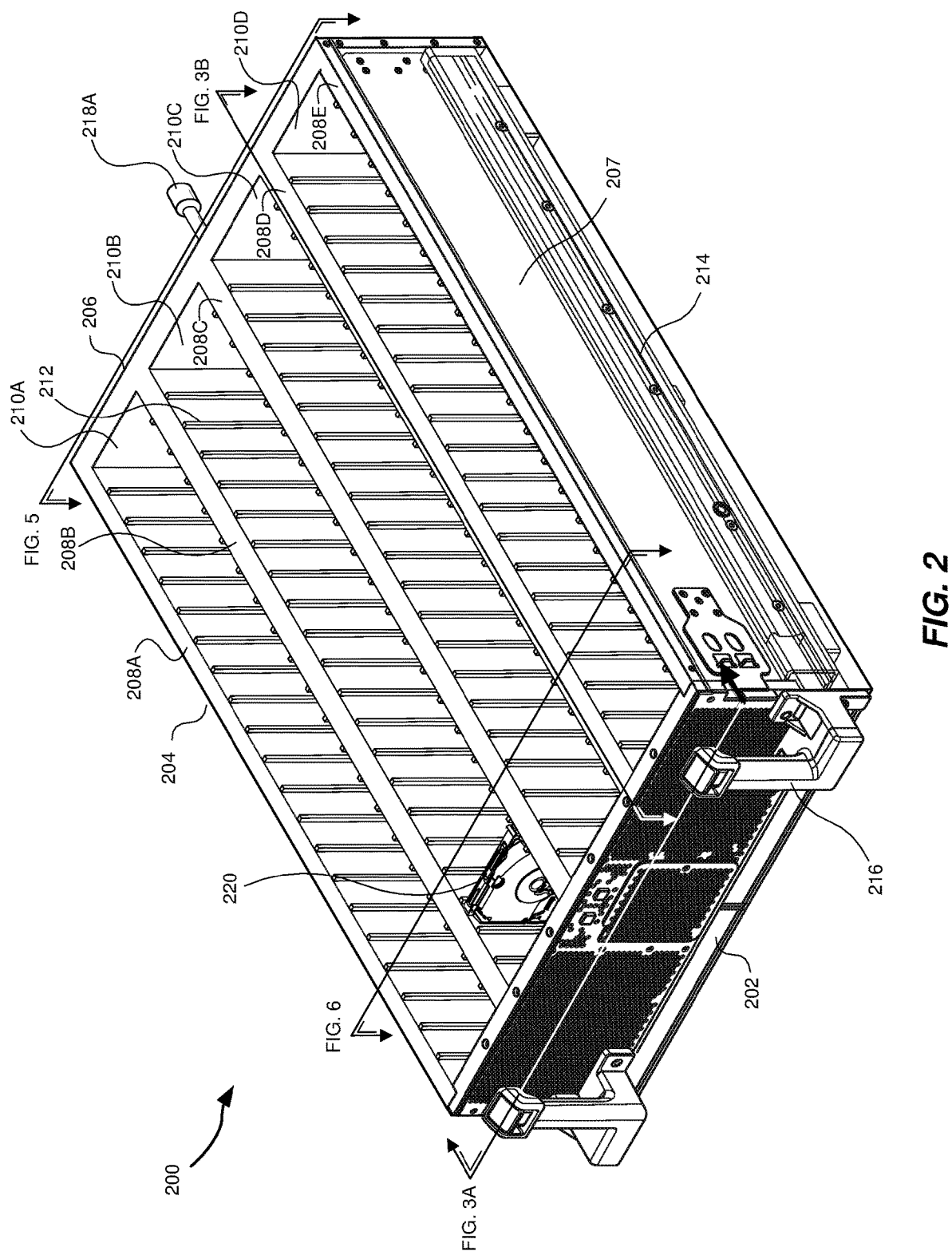
FIG. 2 is a perspective view of a storage drawer chassis that may be inserted into the rack chassis of FIG. 1, according to some aspects of the present disclosure.

FIG. 1 is a perspective view of a rack chassis 100 configured to hold one or more storage drawer chasses, like the exemplary storage drawer chassis 200, according to some aspects of the present disclosure. FIG. 2 shows a perspective view of the exemplary storage drawer chassis 200, according to some embodiments. The rack chassis 100 may be referred to as a "data center rack," which may refer to any multi-system chassis structure for housing multiple storage-system drawers and/or providing support for one or more cables that connect to the storage-system drawer chasses. In some examples, the rack chassis 100 may also contain power supplies, network switches, battery backup units, and/or coolant fluid manifolds, as described herein.

The rack chassis may be adapted receive a storage drawer chassis into a support tray (such as support tray 102) coupled to a frame 104 of the rack chassis 100. The support tray 102 may permit the storage drawer chassis 200 to be slidingly displaced into or out of the rack frame 104 of the rack chassis 100 so that individual storage drives can be more easily accessed. For example the storage drawer chassis 200 may be slid out of the frame 104 on the support tray 102 so that a defective storage drive can be removed from the drawer chassis 200 and replaced. Afterwards the drawer chassis 200 may be slid back into place within the frame 104 of the rack chassis 100.

FIG. 2 is a perspective view of an embodiment of the storage drawer chassis 200 shown in FIG. 1. The term "storage drawer chassis," as used herein, may generally refer to any structure that is adapted to house and provide power and cooling to media storage drives, which may be any of a variety of types of media storage drive with any of a variety of physical dimensions, that make up a storage system. At least one of the media storage drives may be a hard-disk based storage drive. The drawer chassis 200 may accommodate many hard-disk based storage drives, exceeding a hundred or more such storage drives in some embodiments.

As illustrated in FIG. 2, storage drawer chassis 200 may include a frame (e.g., a metallic enclosure) made up of a front side 202, a left side 204, a back side 206, and a right side 207. The storage drawer chassis 200 may include a plurality of thermally-conductive barrier walls or barriers 208A, 208B, 208C, 208D, and 208E, collectively or generally referred to as barriers 208 or as a barrier 208. The barriers 208 may be formed from a conductive material such as a metal, like aluminum. A pair of barriers 208 may define a storage bay 210 extending therebetween. As shown in FIG. 2, the drawer chassis 200 includes barriers 208 defining storage bays 210A, 210B, 210C, and 210D, collectively or generally referred to as storage bays 210 or as a storage bay 210. Other embodiments of the drawer chassis 200 may include more or fewer storage bays 210. As shown in FIG. 2, the storage bays 210 are aligned in the direction of insertion of the drawer chassis 200 into the rack chassis 100 of FIG. 1. The storage bays 210 may be dimensioned to accommodate one or more storage drives like the hard-disk based storage drive 220. In some embodiments, the storage bay 210 may accommodate other media storage drives, which may be any device capable of storing electronic data. In some embodiments, a media storage drive may include flash storage. Other examples of media storage drives may include, without limitation solid state drives, hard disk drives, and/or optical drives. The storage drive 220 may be a serial attached small computer system interface (SAS) drive. In some examples, a media storage drive type may be a serial advanced technology attachment (SATA) drive. In one example, a media storage drive type may be an M.2 drive.

The drawer chassis 200 further includes a plurality of protruding structures, referred to as device guides or slot guides 212 that protrude inwardly from the sidewalls of the thermally-conductive barriers 208. In some embodiments, the slot guides 212 may be formed integrally with the barriers 208, such that the slot guides 212 are formed from the same material as the barriers 208, such as aluminum or any other suitable material. In other embodiments, the slot guides may be formed from a different material. The slot guides 212 made aid a technician in inserting a storage drive 220 into a storage bay 210 in such a manner that a connector of the storage drive 220 may be coupled to a corresponding connector of a bottom connector plate of the drawer chassis 200. The bottom connector plate of the drawer chassis 200 may include connectors corresponding to each available slot, defined by the adjacent slot guides 212 on the sidewalls of the barriers 208 forming an individual storage bay 210, capable of receiving a storage drive 220.

The left side 204 and the right side 207 of the drawer chassis 200 may include a rail 214. The rail 214 may form an insertion system by interfacing with the trays 102 of the rack 100 to permit the drawer chassis 200 to be slid out of the rack frame 104 for service by a technician. The front side 202 may include one or more handles 216 to enable the technician to grasp the drawer chassis 200 for retraction and insertion of the drawer chassis 200 into the rack 100.

As shown in FIG. 2, the drawer chassis 200 may include ports configured to permit the flow of a coolant through the barriers 208. The ports may include one or more inlet/outlet mechanisms 218. The drawer chassis 200 includes a first I/O mechanism 218A (shown explicitly in FIG. 2) and a second I/O mechanism 218B (shown explicitly in FIG. 3B). The I/O mechanisms 218 may include a threaded connection or other secure connection for attaching a flexible conduit or hose to the drawer chassis 200. The I/O mechanisms 218 may further include one or more gaskets and/or valves that form a barrier to the flow of fluid to prevent leakage of coolant from the drawer chassis 200. The valves included in the mechanism 218 may be one-way valves, such that fluid may flow in only one direction through each of the mechanisms 218. For example, the mechanism 218A may permit fluid to enter into the body of the drawer chassis 200, but not exit.

Figure 3A:
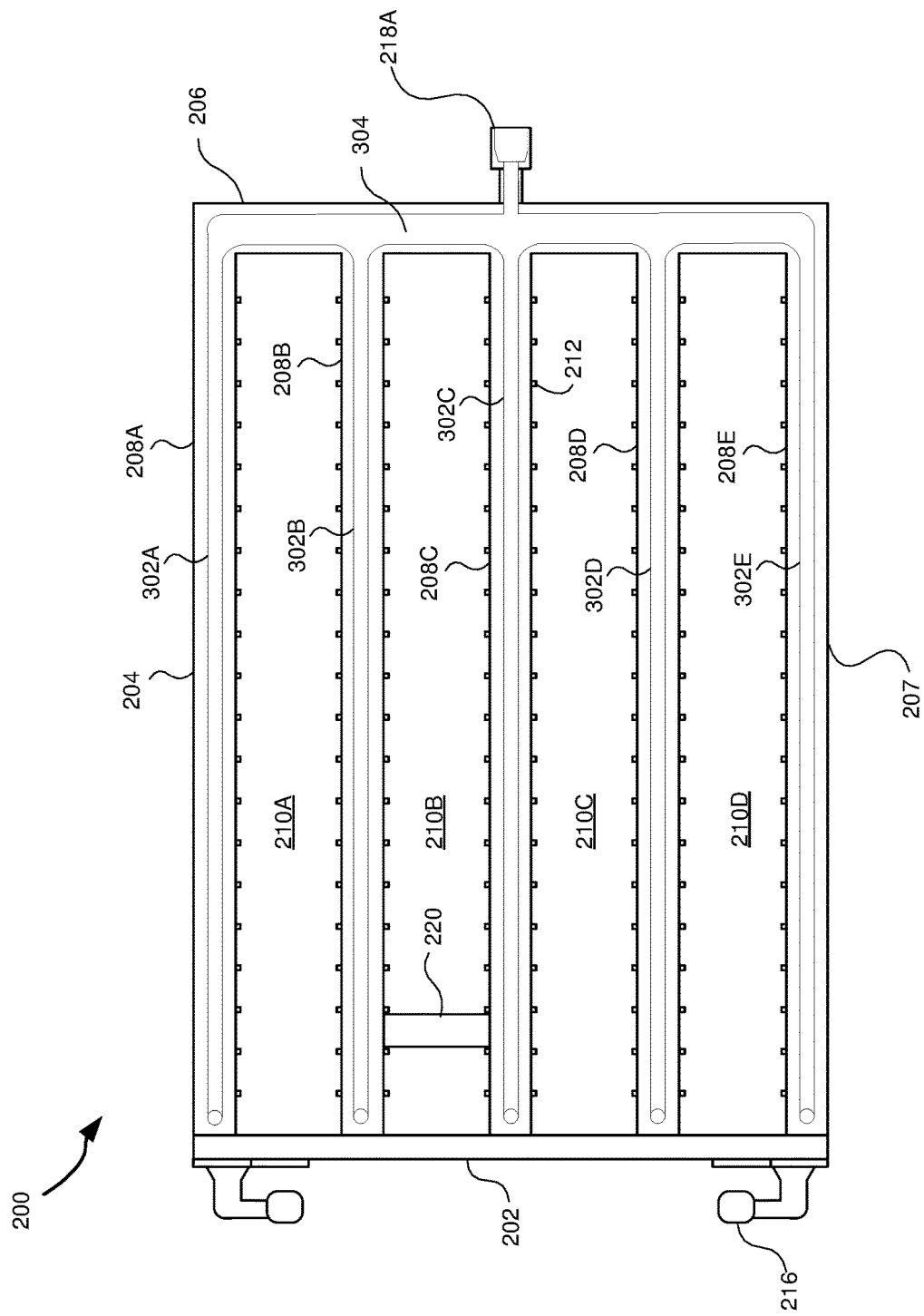
FIGS. 3A, 3B, 3C, and 3D are cross-sectional views of the storage drawer chassis of FIG. 2, according to some aspects of the present disclosure.

FIGS. 3A, 3B, 3C, and 3D are cross-sectional views of the storage drawer chassis of FIG. 2, according to some aspects of the present disclosure. FIG. 3A shows a cross-section along the line 3A shown in FIG. 2, presenting a cross-sectional, top view. The cross-sectional view exposes a plurality of coolant channels 302, with one coolant channel 302 extending along each barrier 208. Some embodiments of the drawer chassis 200 may include some barriers 208 that include a coolant channel 302 and other barriers 208 that do not include such a channel. The coolant channels 302 are coupled to the I/O mechanism 218A by a coolant manifold 304. The coolant manifold 304 may be disposed in the back side 206 of the drawer chassis 200 and may provide an interface between the individual coolant channels 302 and the I/O mechanism 218A. In some embodiments, the manifold 304 may be generally cylindrical in shape and may have a larger diameter than the individual coolant channels 302. The coolant channels 302 may extend approximately the length of the barriers 208 so that the entire length of the barriers 208 may be used to remove heat from the storage drives, without causing high-frequency vibrations that could render high-density reading and writing infeasible. FIG. 3A shows a single coolant channel 302 extending along each barrier; however, other embodiments may include multiple coolant channels 302 extending within a single barrier.

Figure 3B:
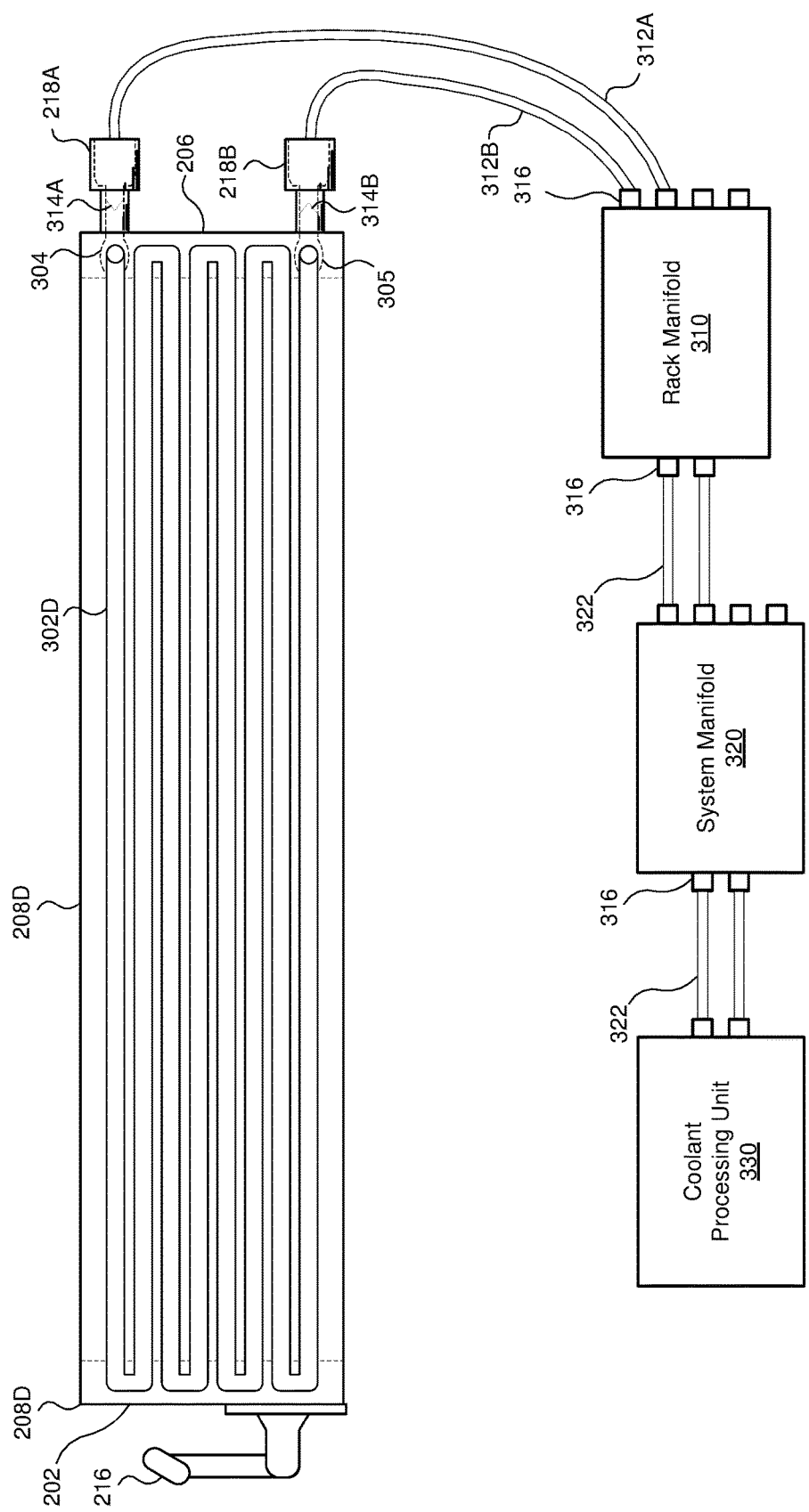

FIG. 3B presents a cross-sectional view along the line 3B of FIG. 2, through the barrier 208D. FIG. 3B shows an embodiments of the coolant channel 302D that extends back and forth between the front side 202 to the back side 206. As shown, the coolant channel 302D may extend between the I/O mechanism 218A and the I/O mechanism 218B in a serpentine pattern to ensure substantial contact between the body of the barrier 208D and the coolant flowing within the coolant channel 302D. Other patterns of coolant channels may be used in other embodiments to provide contact between the barrier 208D and the channel 302D to increase heat transfer between the barrier 208D and the coolant in the channel 302D.

As shown in FIG. 3B, the drawer chassis 200 may be connected to a rack manifold 310 by a flexible hose 312A and a flexible hose 312B. The flexible hose 312A may be connected to an inlet to the drawer chassis 200 provided by the I/O mechanism 218A. In some embodiments, the I/O mechanism 218A may include a valve 314A. The valve 314A may be a one-way valve, in some embodiments, that permits coolant to enter into the coolant manifold 304 and prevents coolant from exiting from the coolant manifold 304 back through the I/O mechanism 218A. The rack manifold 310 may also be coupled to the I/O mechanism 218B by the flexible hose 312B. Like the I/O mechanism 218A, the I/O mechanism 218B may include a valve 314B. The valve 314B may be a one-way valve configured to permit coolant to exit a lower coolant manifold 305 and pass through the I/O mechanism 218B, while preventing the coolant from flowing in the opposite direction. The rack manifold 310 may be coupled to the frame 104 of the rack chassis 100 and may be configured with a plurality of connectors 316 to connect to one or more drawer chasses 200.

In turn, the rack manifold 310 may be coupled to a system manifold 320 by a conduit 322. In some embodiments, the conduit 322 may be a flexible tube, similar to the flexible hoses 312A and 312B in many respects. The system manifold 320 may be coupled to a plurality of rack manifolds, like the rack manifold 310, and may serve to circulate coolant throughout an entire data center or to multiple rack chasses 100. The system manifold 320 may be connected to or may be integrated with a coolant processing unit 330. The coolant processing unit 330 may remove heat from or may cool the coolant that flows through one or more drawer chasses 200 so that the coolant may be circulated and recirculated through the one or more drawer chasses 200. Some embodiments of the present disclosure may include multiple coolant processing units 330 within a single data center. Additionally, some embodiments of the present disclosure may include a coolant processing unit 330 secured to, or within, the rack manifold 310, such that the coolant may be at least partially processed on a per rack basis. In some such embodiments, the system manifold 320 may be omitted. The drawer chassis 200 and the coolant processing unit 330 may provide a storage-media heat mitigation system.

Figure 3C:
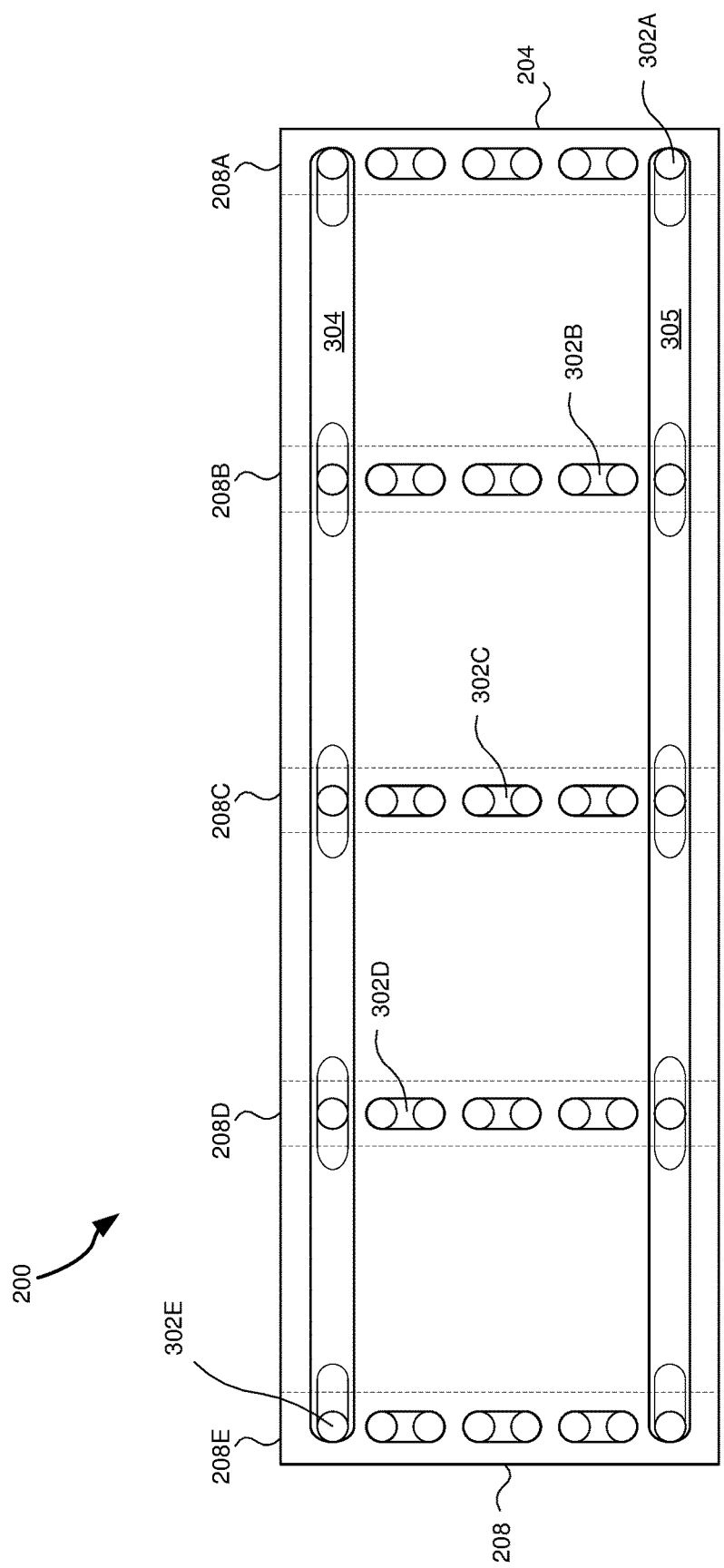
Figure 3D:
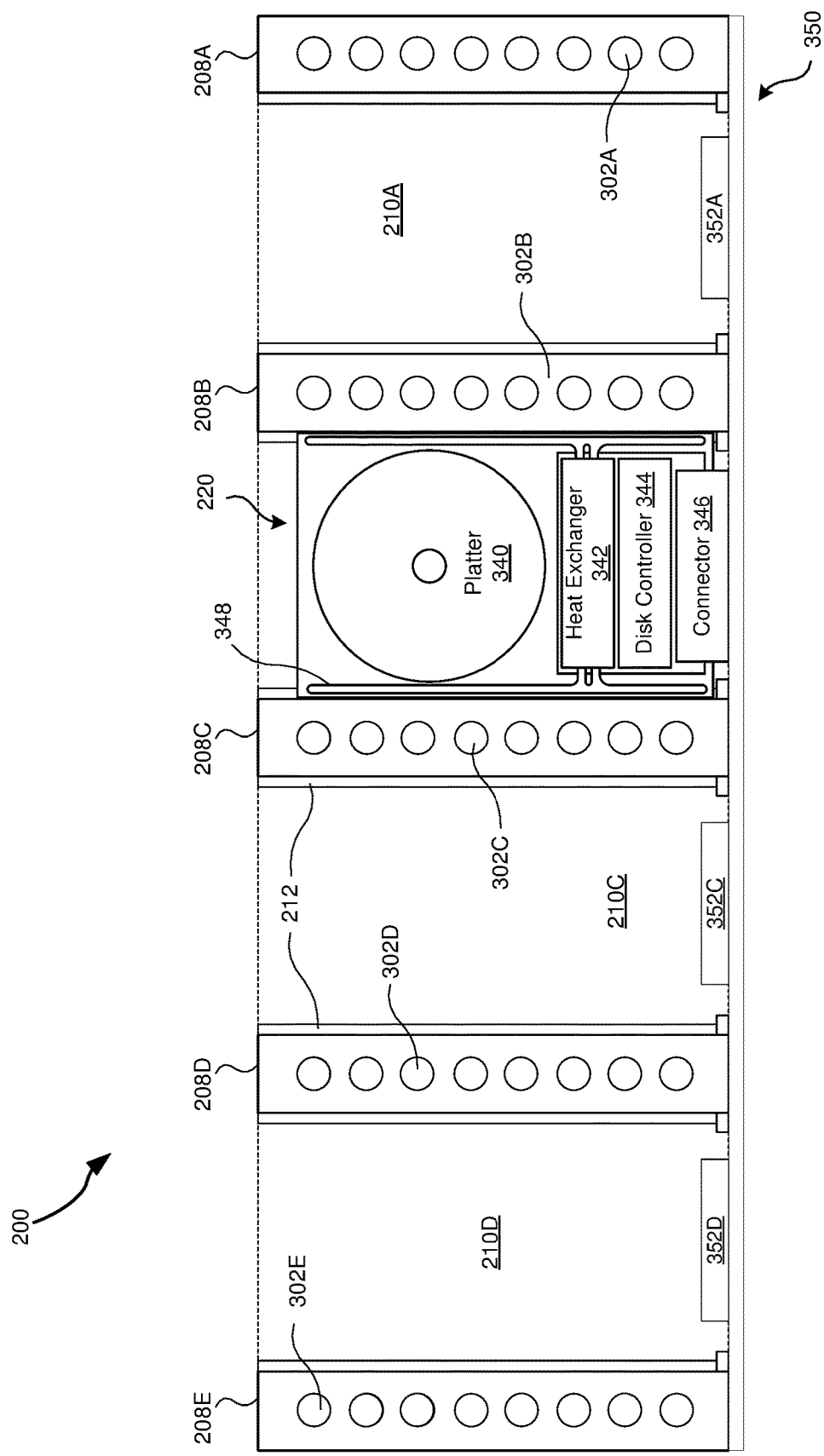

FIG. 3C shows a cross-sectional view of the drawer chassis 200 through the back side 206. As can be seen in FIG. 3C, the diameter of the coolant manifolds 304 and 305 may be larger than the diameter or diameters of the coolant channels 302, in some embodiments. The cross-sectional view of FIG. 3C shows the portion of the serpentine shaped channels 302 in which the direction of flow changes direction within the barriers 208. FIG. 3D shows a cross-sectional view of the drawer chassis 200 that is parallel to the view of FIG. 3C. However, the view of FIG. 3D shows the drawer chassis 200 as cross-sectioned through the exemplary storage drive 220 of FIG. 2. The storage drive 220 is shown in a block diagram that provide some exemplary details of some embodiments of storage drives, according to aspects of the present disclosure.

The storage drive 220 may include a disk or platter 340, which may be a plurality of platters in some embodiments, that has a magnetic surface capable of being manipulated to store information in digital form. As described herein, the platter 340 and/or other components of the storage drive 220 may produce heat during operation. Removal or mitigation of the heat may improve operation of the storage drive 220, and so some embodiments of the storage drive 220 may include a heat exchanger 342 that facilitates the collection and removal of heat produced by the storage drive 220. The heat exchanger 342 may also collect heat produced by other components, such as the disk controller 344, which may control the operation of the platter 340 to read data from and write data to the material of the platter 340, and a connector 346, which may couple the storage drive 220 to a bottom connector plate 350 that provides corresponding connectors 352A, 352B (not explicitly shown), 352C, and 52D that include power supplies and data transfer connections to a plurality of storage drives when positioned within the storage bays. To improve the transfer of heat from the storage drive 220 to the thermally-conductive barriers 208, the storage drive 220 may include one or more heat pipes 348. As shown, the storage drive 220 includes a first heat pipe 348 positioned nearby or proximate to the barrier 208C and a second heat pipe 348 positioned proximate to the barrier 208B. The heat generated by the operation of the storage drive 220 may be transmitted through the sidewalls of the storage drive into the barriers 208.

Figure 4A:
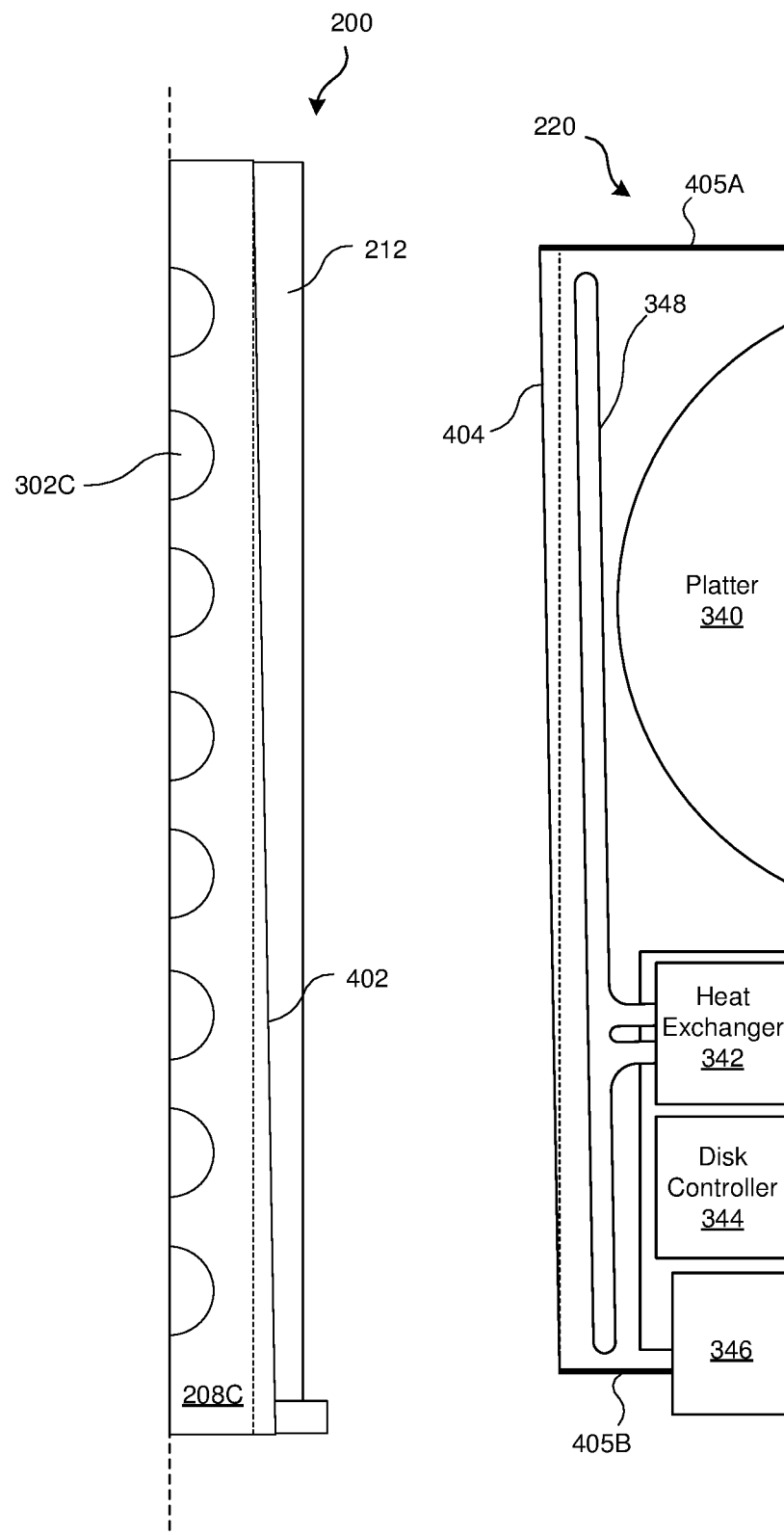
FIGS. 4A, 4B, 4C, 4D, and 4E are partially cross-sectional views showing aspects of the contact between a storage drive and a wall of the storage drawer chassis of FIG. 2, according to some aspects of the present disclosure.

FIGS. 4A, 4B, 4C, 4D, and 4E are partially cross-sectional views showing aspects of the contact between a sidewall of the storage drive 220 and a sidewall of the storage drawer chassis 200 of FIG. 2, according to some aspects of the present disclosure. As shown in FIG. 4A, the sidewall 402 of the barrier 208C may not be perfectly orthogonal to the length of the barriers 208, such that it forms a greater or lesser angle. The sidewall 404 of the storage drive 220 may form a corresponding angle. When the storage drive 220 is connected to the connector plate 350, which may be fixedly or releasably secured to the bottom of the drawer chassis 200, the connection may provide an amount of force to the storage drive 220 in the direction of the connection. The force may pull the storage drive 220 into the storage bay 210B, applying pressure between the sidewall 402 and the sidewall 404. The pressure applied between the sidewall 402 of the barrier 208C and the sidewall 404 of the storage drive 220 may provide for improved heat transmissive contact and, thereby, improved heat transfer from the storage drive 220 to the barrier 208C. In some embodiments, the sidewall 404 may be formed from a material that conducts heat better than a material used on a top side 405A and a bottom side 405B of the storage drive 220.

Figure 4B:
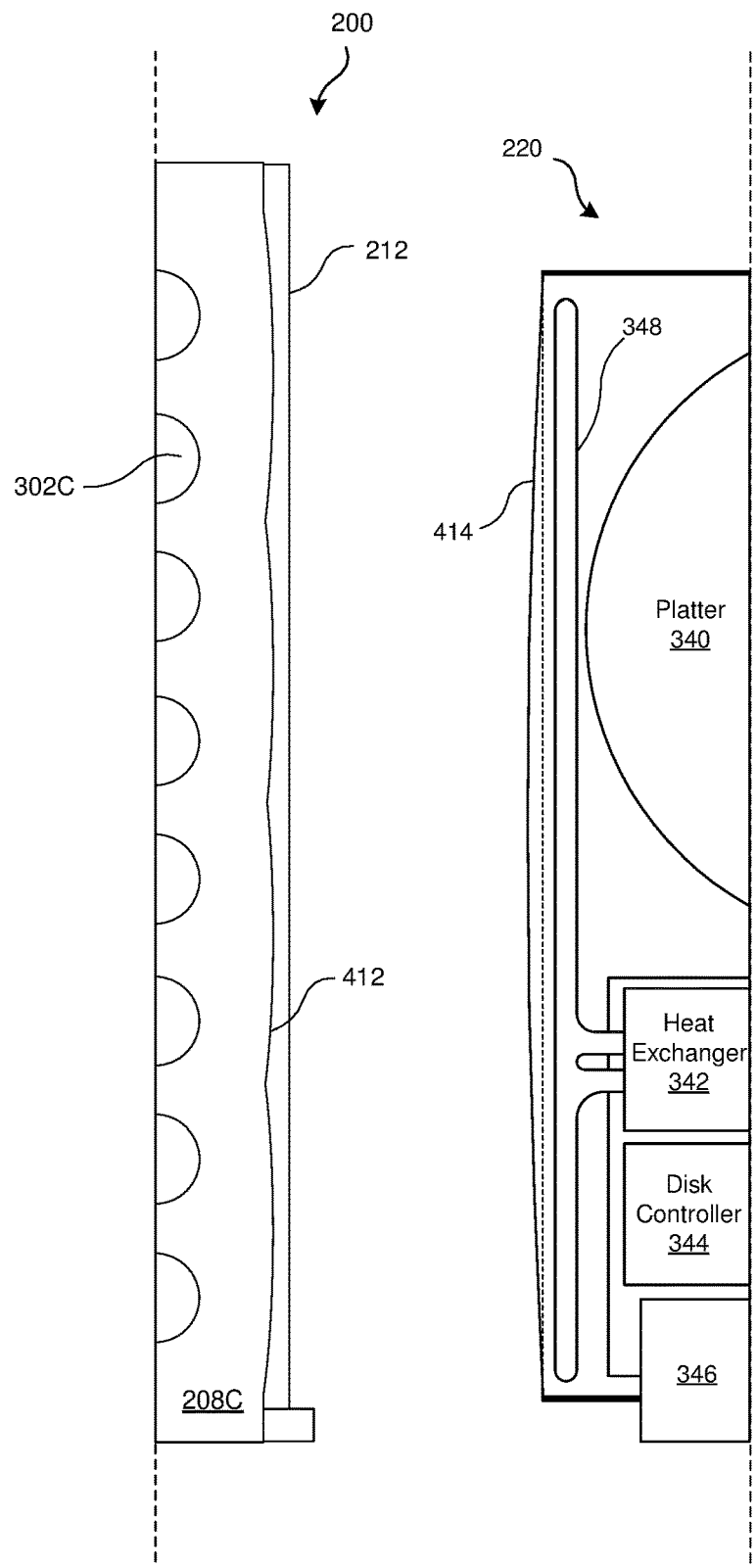

FIG. 4B shows alternative embodiments of the storage drive 220 and a barrier wall of the storage drawer chassis 200. As shown in FIG. 4B, the sidewall 412 of the barrier 208C may include one or more bumps or protruding surfaces having an elliptical or spherical cross-section. As shown, the sidewall 412 includes four such bumps; however, other embodiments of the sidewall 412 may include more or fewer bumps. The material of the barrier 208C may be generally rigid, but may be able to conform somewhat to other structures, such as the storage drive 220, such that the most protruding portions of the bumps of the sidewall 412 may be compressed slightly when a storage drive 220 is connected to the bottom storage plate 350. As shown, the sidewall 414 of the storage drive 220 includes one protruding surface or bump having a generally spherical or elliptical cross section. Other embodiments of the sidewall 414 may include more bumps. In some embodiments, the sidewall 414 of the storage drive 220 may include recessed surfaces that correspond to the bumps of the sidewall 412.

Figure 4C:
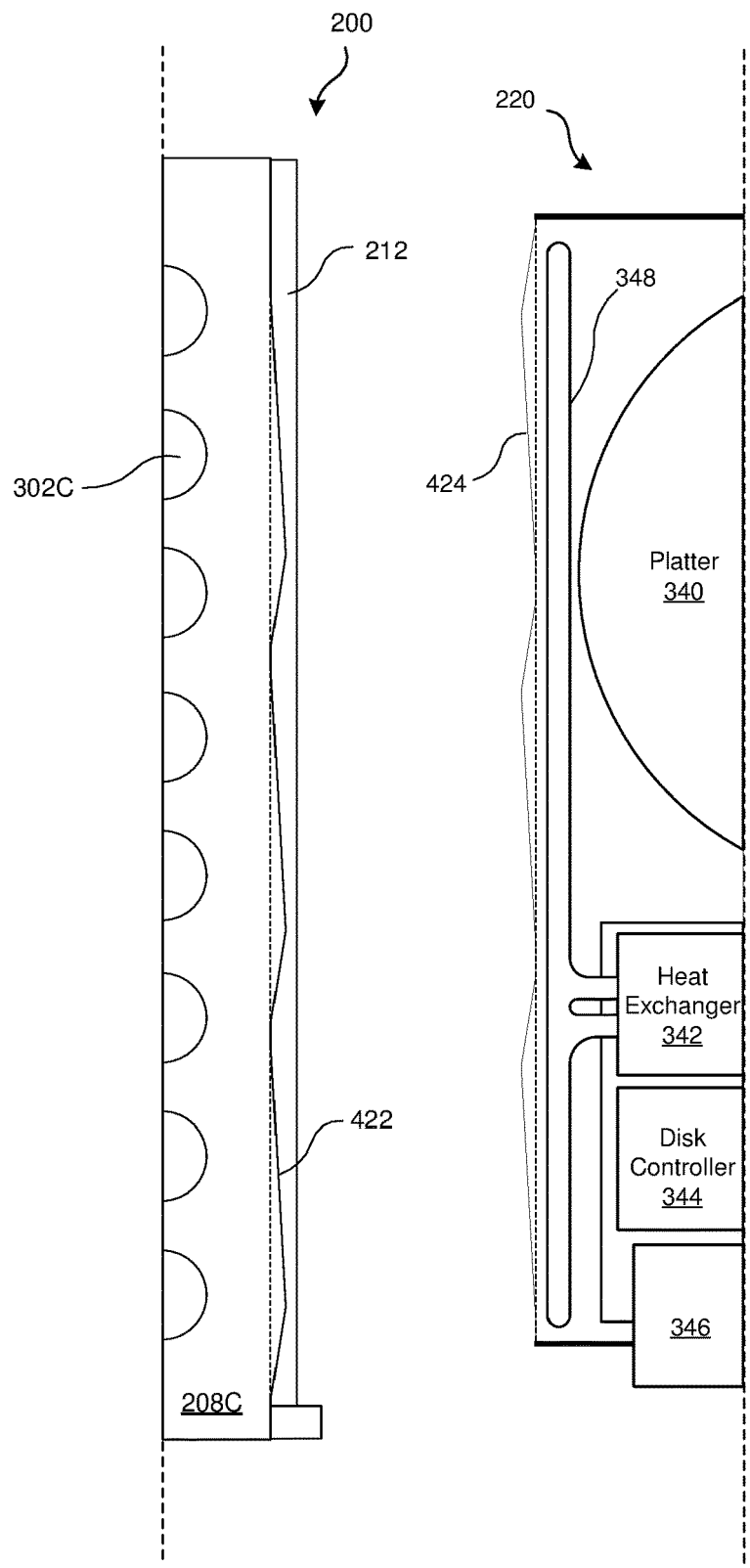

FIG. 4C shows additional alternative embodiments of the storage drive 220 and the barrier 208C of the drawer chassis 200. The barrier 208C may include a sidewall 422 having a series of ramps protruding from the surface thereof. Corresponding protrusions may be included in a sidewall 424 of the storage drive 220. The ramps included on the sidewall 424 may have an orientation opposite to the ramps of the sidewall 422. The ramps on the sidewalls 422 and 424 may increase the contact between the barrier 208C and the storage 5220, such that heat transfer from the storage drive 220 to the barrier 208C of the storage drawer chassis 200 may be improved.

Figure 4D:
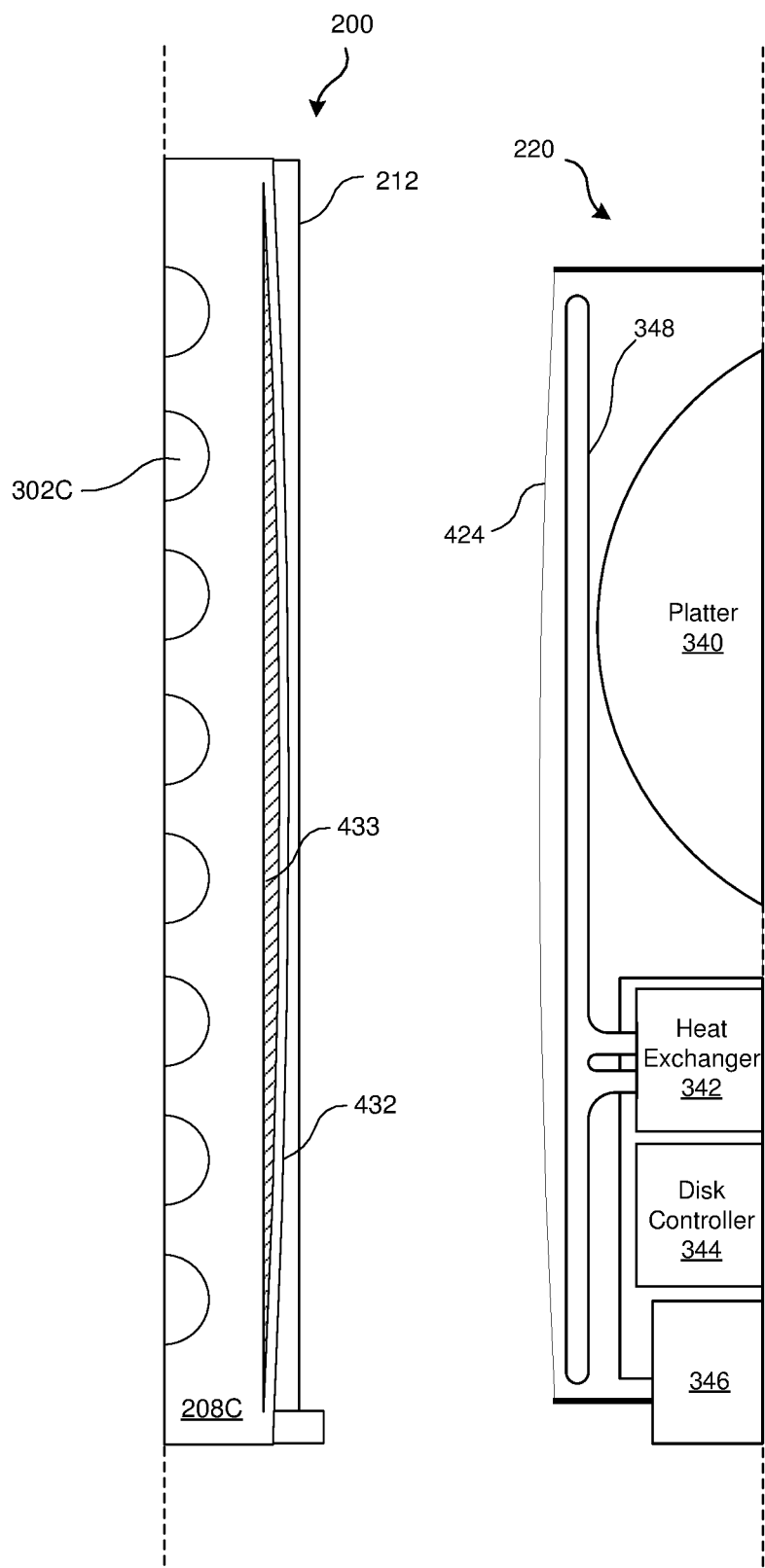
Figure 4E:
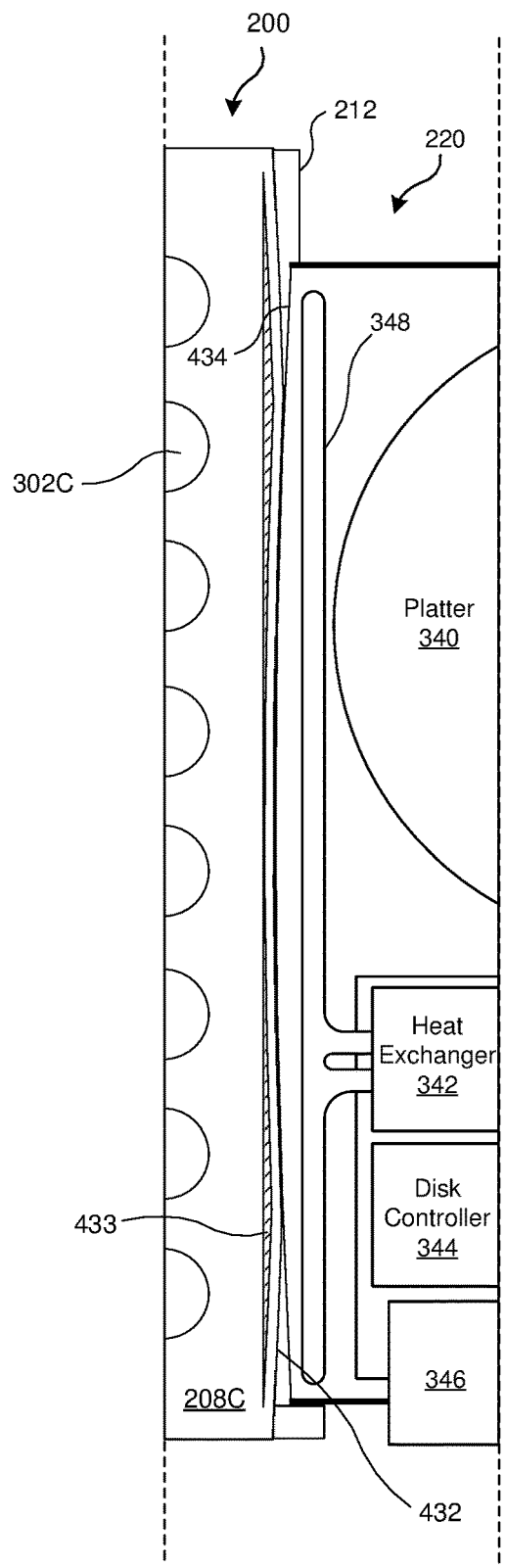

FIGS. 4D and 4E show another embodiment of the storage drive 220 and the barrier 208C of the drawer chassis 200. The embodiment shown in FIG. 4D includes a sidewall 432 that protrudes into the storage bay 210B. The sidewall 432 may be formed integrally with the main bulk of the barrier 208C or may be a sheet of the same material or different material joined onto the barrier 208C, by welding or education, etc. Between the sidewall 432 and the bulk of the barrier 208C, a chamber 433 may be formed. The chamber 433 may facilitate accommodation by the sidewall 432 when a storage drive 220 is inserted into the storage bay 210B. When a storage drive 220 is inserted into the storage bay 210B, the sidewall 434 of the storage drive 220 may cause the sidewall 432 to deform inwardly into the chamber 433. The sidewall 432 may provide some resistance to the deformation, exerting pressure against the sidewall 434, thereby increasing the heat-transmissive contact between the storage drive 220 and the barrier 208C of the drawer chassis 200. In some embodiments, the chamber 433 may be filled with a low-thermally-conductive material, such as air or nitrogen. In some other embodiments, the chamber 433 may be filled completely or partially with a conductive material, such as a thermal grease or other deformable transmitter of thermal energy that may improve transfer of heat from the sidewall 432 to the bulk of the barrier 208C.

Figure 5A:
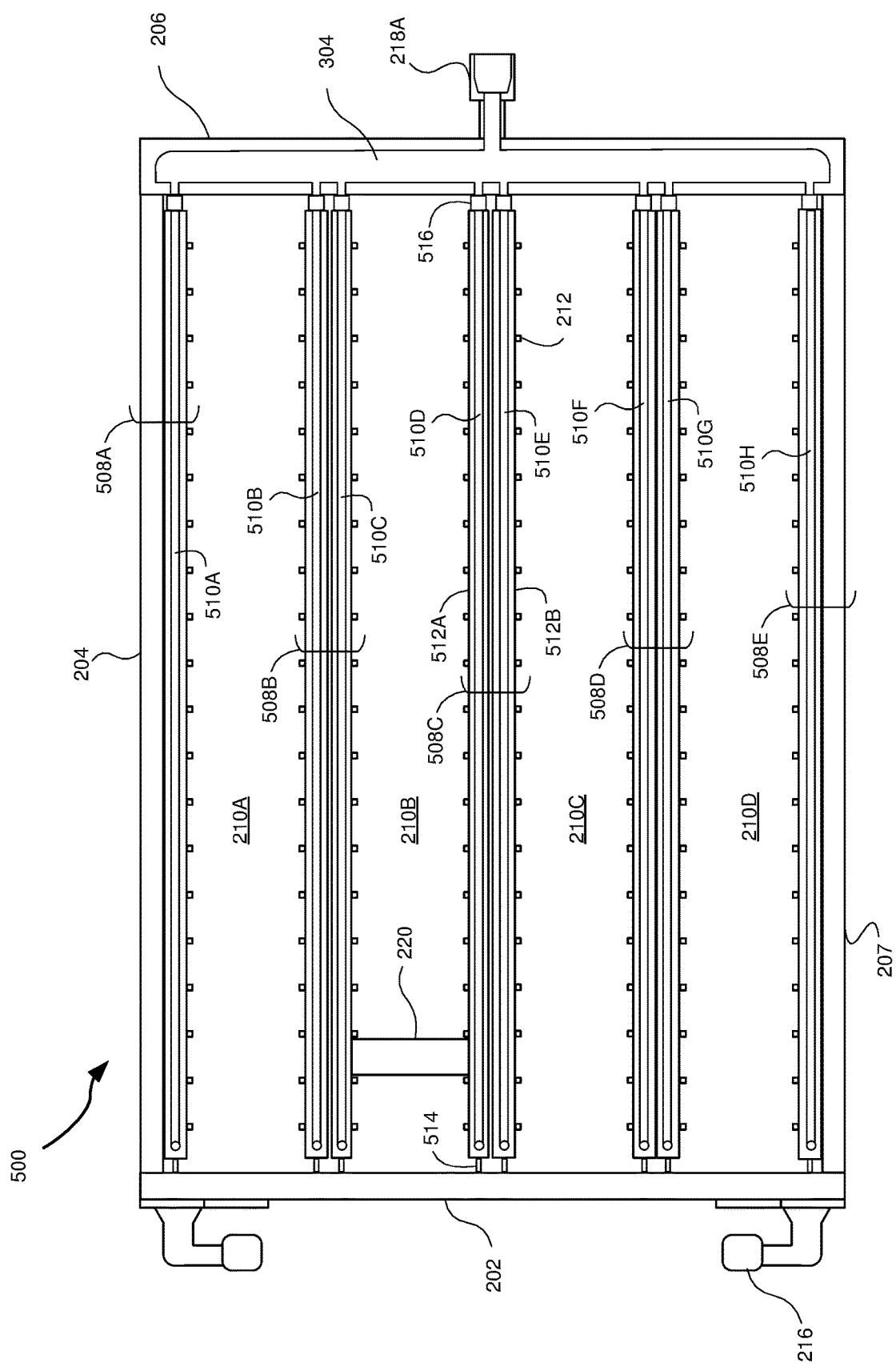
FIGS. 5A, 5B, and 5C are cross-sectional views of another storage drawer chassis that may be inserted into the rack chassis of FIG. 1, according to some aspects of the present disclosure.
Figure 5B:
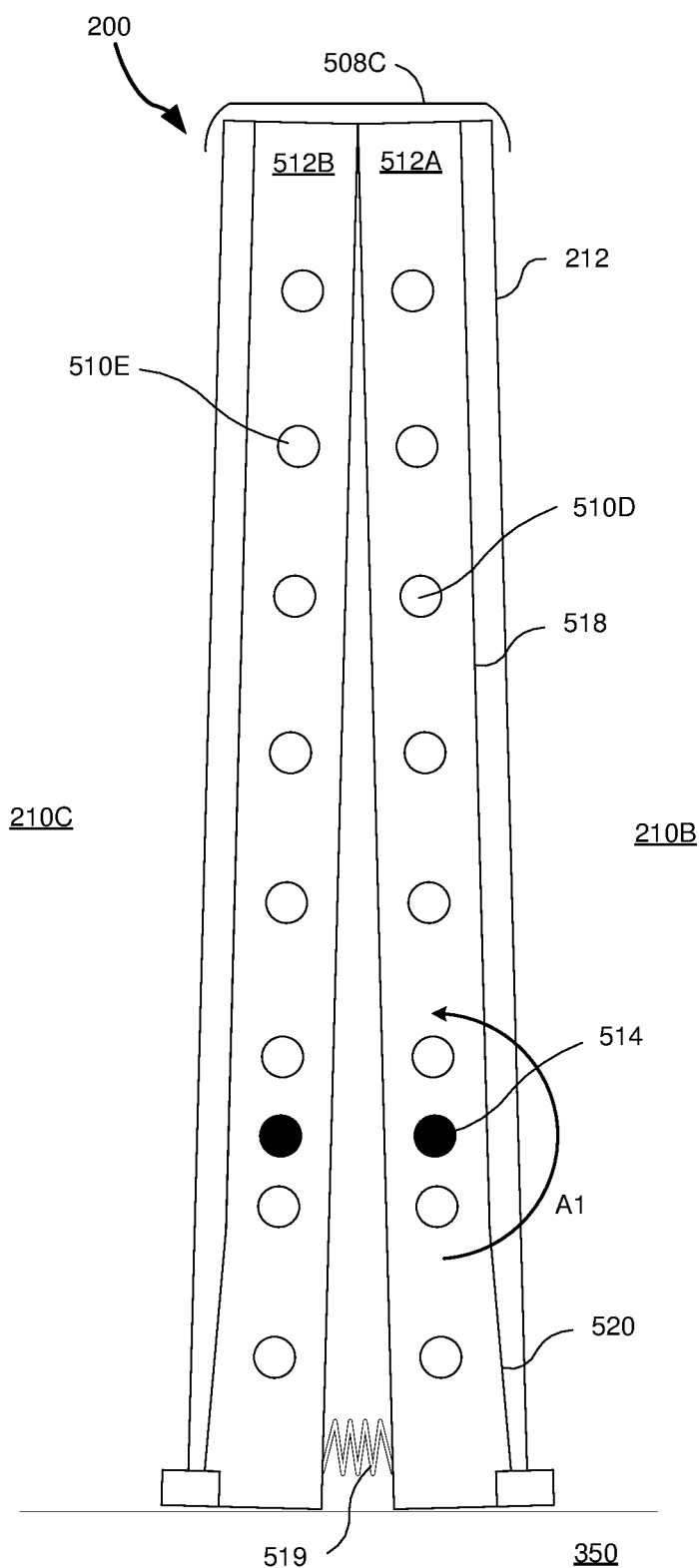
Figure 5C:
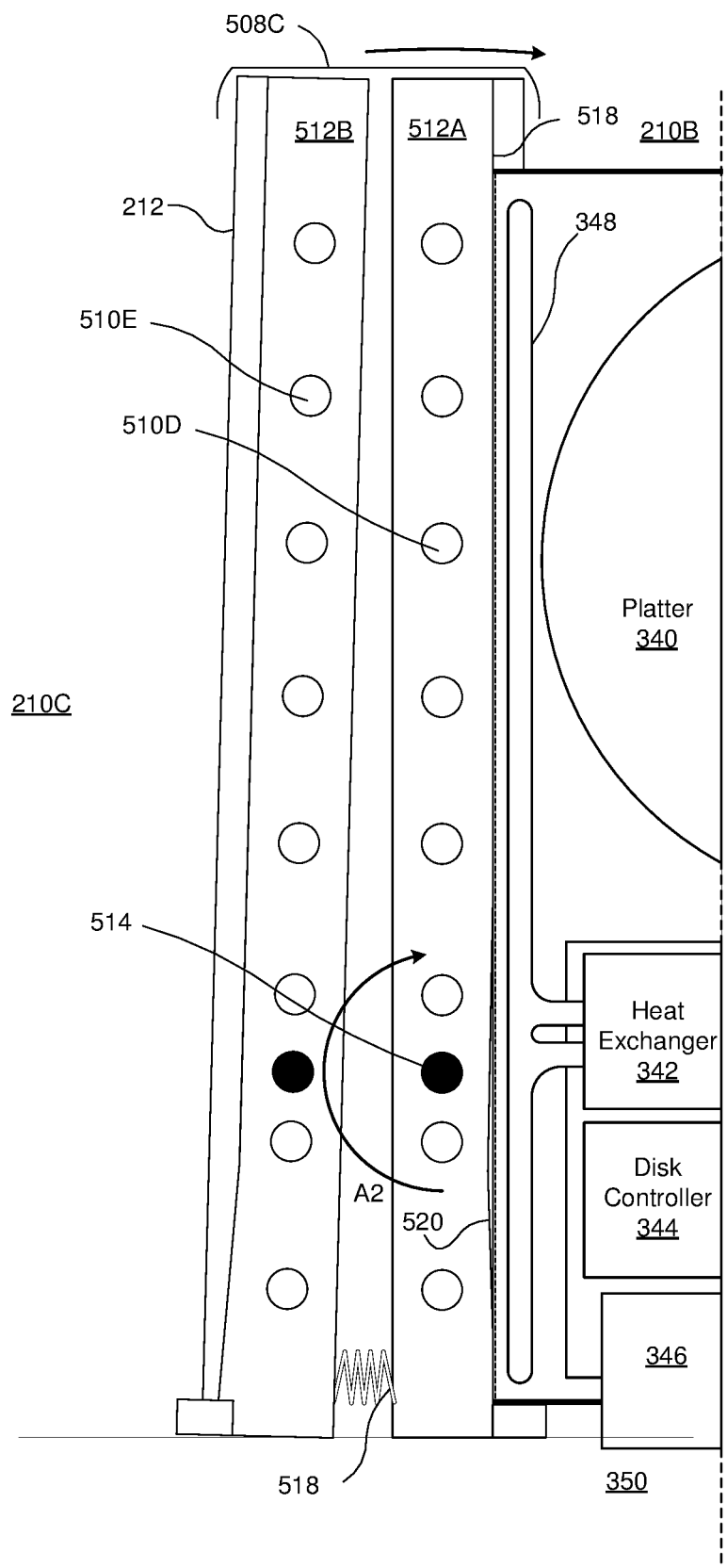

FIGS. 5A, 5B, and 5C are cross-sectional views of another storage drawer chassis 500 that may be inserted into the rack chassis frame 104 of FIG. 1, according to some aspects of the present disclosure. FIG. 5A is a cross-sectioned top view of the storage drawer chassis 500, which may share many of the features previously described herein with respect to the storage drawer chassis 200 of FIG. 2 and others. The storage drawer chassis 500 may include one or more barriers that are configured to apply contacting pressure to storage drives inserted therebetween and may include a front side 202, a left side 204, a back side 206, and a right side 207.

As illustrated in FIG. 5A, the drawer chassis 500 may include a plurality of thermally-conductive barrier walls or barriers 508A, 508B, 508C, 508D, and 508E, collectively or generally referred to as barriers 508 or as a barrier 508. As shown in FIG. 5A, the drawer chassis 500 may include barriers 508 defining storage bays 210A, 210B, 210C, and 210D. Other embodiments of the drawer chassis 500 may include more or fewer storage bays 210. Each of the barriers 508 may include one or more moveable wall sections. The barriers 508A and 508E, which are proximate to the exterior of the drawer chassis 500, may include a movable wall section and a fixed wall section, with the fixed wall section forming part of the frame of the drawer chassis 500.

The barriers 508 may include coolant channels 510 extending along the length of the barriers 508. As a more specific embodiment, the barrier 508A may include a coolant channel 510A, the barrier 508B may include coolant channels 510B and 510C, the barrier 508C may include coolant channels 510D and 510E, the barrier 508D may include coolant channels 510F and 510G, and the barrier 508E may include a coolant channel 510H. As shown in FIG. 5A, each barrier wall section may include a single coolant channel. For example, the barrier 508C may include a first barrier wall section 512A and a second barrier wall section 512B. The barrier wall section 512A may include the coolant channel 510D and the barrier wall section 512B may include the coolant channel 510E. In other embodiments, each barrier wall section 512 may include multiple coolant channels.

The movable barrier wall sections 512 may each include a barrier wall pivot 514 about which each barrier wall section 512 may pivot to receive one or more storage drives in a caromed configuration that may apply pressure between the barrier wall sections and the storage drive(s), to increase surface contact and associated heat transfer away from the storage drive 220. Additionally, each barrier wall section 512 may include a coolant conduit 516 that may accommodate movement of the associated barrier wall section 512 and the flow of coolant through the coolant channel extending within the barrier wall section. In some embodiments, the coolant conduit may be coaxial with the barrier wall pivot 514. Such a coolant conduit 516 may include an inlet channel and an outlet channel to provide for both the provision of the coolant and the removal of the coolant from the barrier 508. The coolant conduit 516 may be rigid in such embodiments. In other embodiments, multiple coolant conduits 516 may be coupled to a single barrier wall section 512 to introduce coolant from the coolant manifold 304 and to return coolant to the coolant manifold 306. Such coolant conduits 516 may be flexible to accommodate the relative change in position between the barrier wall section 512 and the manifolds 304 and 306 when the barrier wall section 512 rotates about the barrier wall pivot 514 as the storage drive 220 is received into a storage bay 210.

FIG. 5B presents a cross-section of the barrier 508C. As can be seen in FIG. 5B, the barrier wall sections 512A and 512B may each pivot about a barrier wall pivot 514. For example, the barrier wall section 512A may pivot around the barrier wall pivot 514 according to the arrow A1 when a force is applied by a bias element 519. The bias element 519, which may be a spring or another compressed member, biases the barrier wall sections 512 in an open position that facilitates insertion of the storage drive 220 by providing a greater opening at the entry of the storage bay 210B. When a storage drive 220 is inserted into the storage bay 210B, the sidewall of the storage drive 220 may make contact with the sidewall of the barrier 508C. In some embodiments, the sidewalls of the barriers 508 may be configured to interact differently with an inserted storage drive 220 at different stages of the insertion. For example, the sidewall 518 of the barrier wall section 512A may include a substantially planar surface with one or more deviations, such as the ramp portion 520 of the sidewall 518. As shown in FIG. 5B, the ramp portion 520 may angle away from the substantially planar portion of the sidewall 518 into the storage bay 210B. In other embodiments, the ramp portion 520 may be a curved surface curving away from the plane of the substantially planar portion of the sidewall 518 into the storage bay 210B. The ramp portion 520 may cause the width of the storage bay 210B to be narrower at the bottom than at the top.

As shown in FIG. 5C, when the storage drive 220 is inserted into the storage bay 210B the sidewall of the storage drive 220 eventually contacts the ramp portion 520. As the sidewall of the storage drive 220 contacts the ramp portion 520, the barrier wall section 512A may be forced to pivot around the pivot 514 in the direction show by arrow A2, which is also shown by arrow AB at the tip of the barrier wall section 512A. This force may push the sidewall 518 into increased contact with the sidewall of the storage drive 220. In some embodiments, the barrier wall section 512A may deform during insertion of the storage drive 220, such that the angle between the main area of the sidewall 518 and the ramp portion 520 increases compared to when no storage drive 220 is present.

Figure 6A:
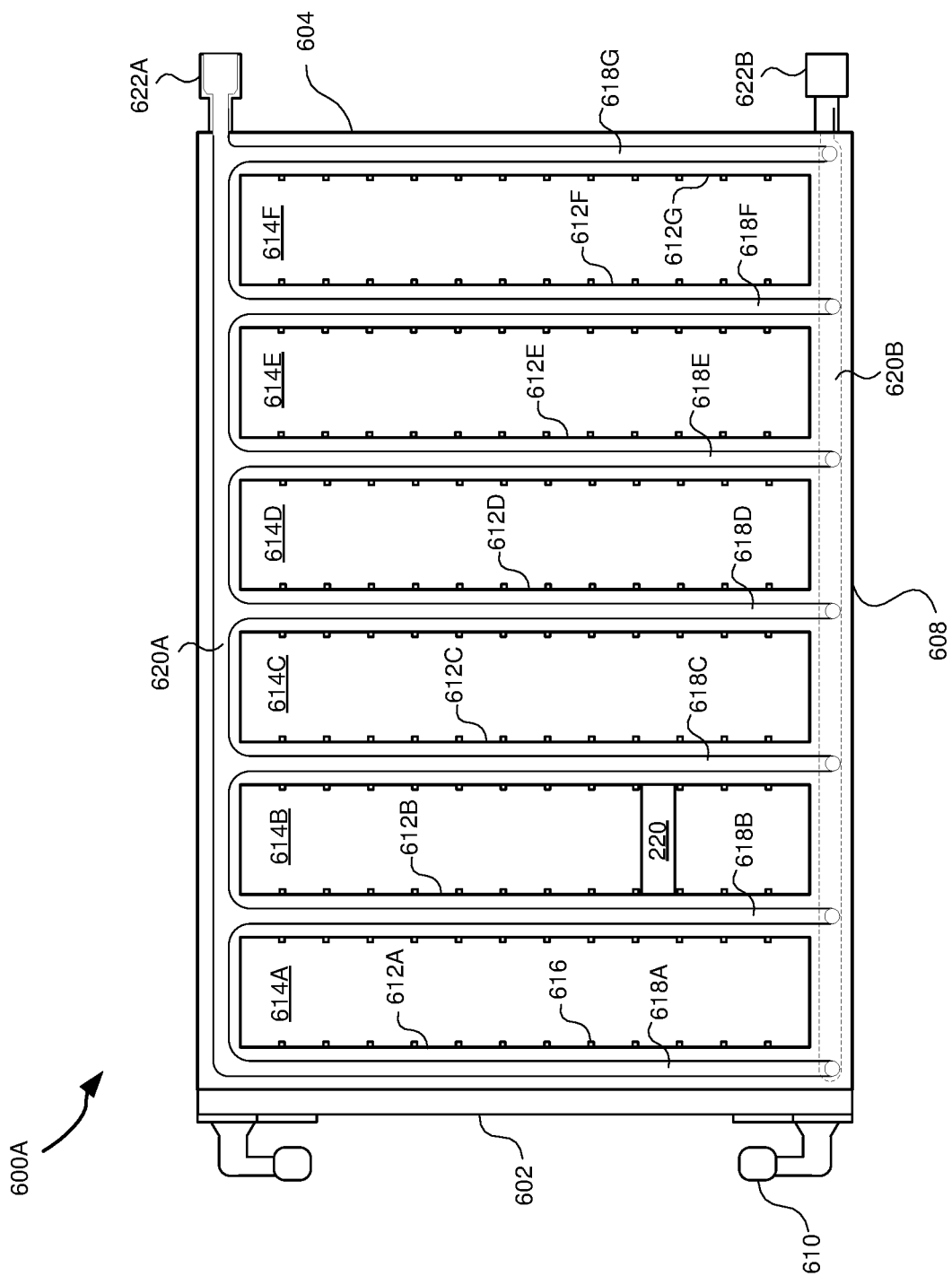
FIGS. 6A and 6B are cross-sectional views of additional storage drawer chasses that may be inserted into the rack chassis of FIG. 1, according to some aspects of the present disclosure.
Figure 6B:
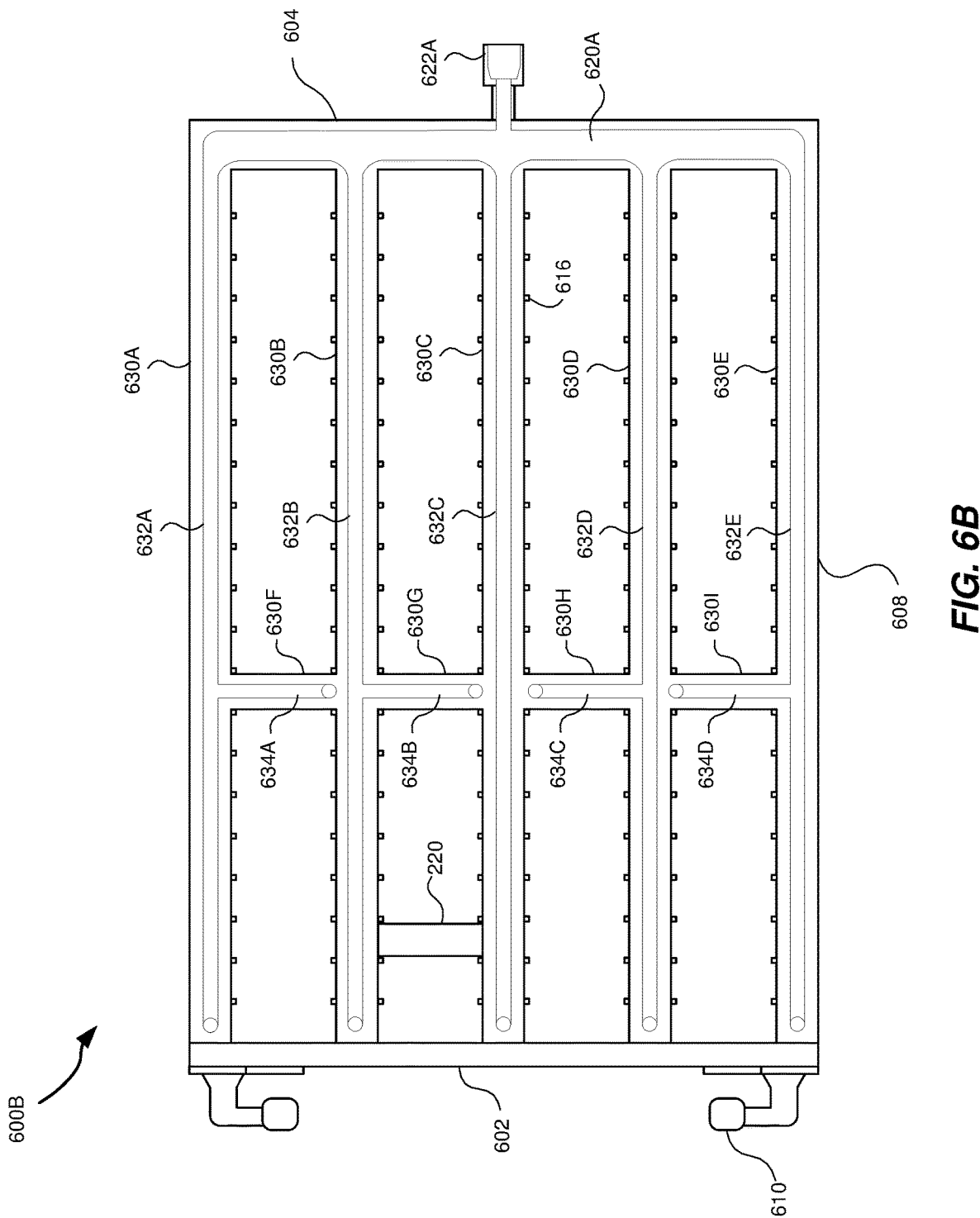

FIGS. 6A and 6B are top, cross-sectional views of additional embodiments of storage drawer chasses 600A and 600E that may be inserted into the rack chassis 100 of FIG. 1, according to some aspects of the present disclosure. The drawer chasses 600A and 600B may both include a frame having a front side 602, a back side 604, a left side 606, and a right side 608. The drawer chasses 600A and 600B may also include one or more handles 610 permitting a technician to more easily displace the drawer chasses 600A and 600B relative to the rack chassis 100.

The drawer chassis 600A may include a plurality of barriers 612, individually referred to as barriers 612A, 612B, 612C, 612D, 612E, 612F, and 612G. The barriers 612 may be formed from any suitable thermally-conductive material and may define a plurality of storage bays 614, individually referred to as storage bays 614A, 614B, 614C, 614D, 614E, and 614F. The barriers 612 and the storage bays 614 may be oriented orthogonally relative to a direction of insertion and retraction of the drawer chassis 600A relative to the rack 100. The storage bays 614 may be lined with slot guides 616 that define slots into which a storage drive, like the exemplary storage drive 220, may be inserted.

Like in other drawer chasses described herein, the thermally-conductive barriers 612 may absorb heat produced by the storage drives 220. The barriers 612 each include at least one coolant channel 618 extending along the length of the barriers. The coolant channels 618A, 618B, 618C, 618D, 618E, 618F, and 618G may have a serpentine path that makes multiple passes back and force within the barriers 612. The coolant channels may be coupled, at one end, to a coolant manifold 620A extending along the left side 606 and, at another end, to a coolant manifold 620E extending along the right side 608 of the drawer chassis 600A. The coolant manifold 620A may be coupled in an inlet mechanism 622A, while the coolant manifold 620E may be coupled to an outlet mechanism 622B, in some embodiments.

FIG. 6B shows the drawer chassis 600B, which may include barriers 630 that extend in different directions. The barriers 630 may include lengthwise barriers 630A, 630B, 630C, 630D, and 630E, and orthogonal barriers 630F, 630G, 630H, and 630I. The addition of the orthogonal barriers 630F-I may provide for additional cooling of storage drives like the storage drive 220, inserted into the divided storage bays.

Coolant channels 632A, 632B, 632C, 632D, and 632E extend along the barriers 630A-E. At least some of the coolant channels 632A-E may include a coolant channel spur that extends orthogonally within the orthogonal barriers 630F-I. As shown the coolant channel 632A may couple to a channel spur 634A, the coolant channel 632B may couple to a channel spur 634B, the coolant channel 632D may couple to a channel spur 634C, and the coolant channel 632E may couple to a channel spur 634D. The channel spurs 634A-D may have a serpentine path in some embodiments and may be connected at an opposite end to the return paths of their respective coolant channels. Aspects of the various drawer chasses may be combined in various embodiments.

Figure 7:
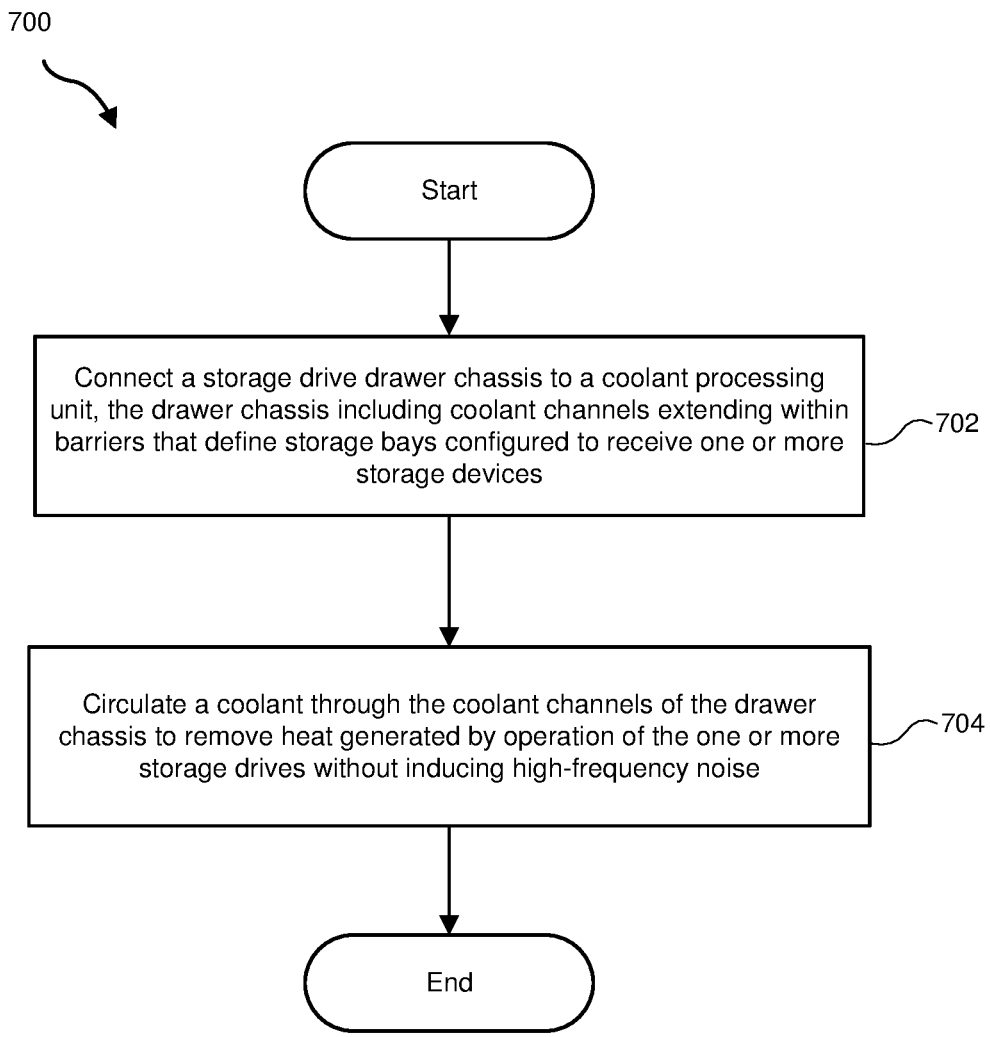
FIG. 7 is a flow chart of an exemplary method 700 for mitigating heat produced by a plurality of storage drives without subjecting the storage drives to high-frequency vibrations.

FIG. 7 is a flow diagram of an exemplary method 700 for mitigating heat produced by a plurality of storage drives without subjecting the storage drives to high-frequency vibrations produced by air cooling fans. At step 702, an embodiment of the drawer chasses described herein, such as chasses 200, 500, 600A, 600B, or a combination of the various features of such chasses, may be connected to a coolant processing system. For example, a flexible hose 312A may be connected to a chassis inlet mechanism 218A and another flexible hose 312B may be connected to a chassis outlet mechanism 218B. The flexible hoses 312A and 312B may also be connected directly or indirectly to a coolant processing unit 330.

At step 704, a coolant may be circulated through coolant channels extending within the drawer chassis. For example, power may be supplied to the coolant processing unit 330, which may circulate the coolant through the coolant channels 302 of the drawer chassis 200, shown in FIG. 3A. The coolant may be a liquid or a gas and may be cooled by the coolant processing unit before, during, and/or after circulation through the drawer chassis. By circulating the coolant through the drawer chassis, rather than relying solely on fans to circulate air across the storage drives, the high-frequency noise/vibrations introduced by the fans may be eliminated or decreased. The mitigation of high-frequency noise may permit the hard-disk drives included in at least some of the storage drives to operate with more precision, providing for a narrower recording track increasing the density with which data can be reliably stored on the platter(s) of the drives.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

Embodiments of the present disclosure may provide for cooling of large numbers of storage drives by using a contained liquid or gas coolant circulating through the drawer chasses that hold the storage drives. Embodiments of the present disclosure may provide cooling without inducing high-frequency noise and vibration associated with conventional fan-cooling approaches. By reducing these vibrations, the storage drives may be able to read and write more precisely and so may be able to store information at higher densities.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including"

and "having" (and their derivatives), as used in the specification and claims, are interchangeable with and have the same meaning as the word "comprising."

What is claimed is:
1. An apparatus comprising:
a storage drawer chassis comprising thermally-conductive barrier walls that extend lengthwise from a front end of the storage drawer chassis to a back end of the storage drawer chassis, pairs of the thermally-conductive barrier walls defining storage bays adapted to receive one or more hard-disk-based storage drives,
the one or more hard-disk based storage drives are inserted into one or more slots defined within the storage bays;
at least one thermally-conductive barrier wall of the thermally-conductive barrier walls comprises a series of ramps protruding from a surface of the at least one thermally-conductive barrier wall; and
a sidewall of a storage device, configured to be inserted into a storage bay defined by the at least one thermally-conductive barrier wall, comprises corresponding ramps, protruding from a surface of the sidewall, with an orientation opposite to the ramps protruding from the surface of the at least one thermally-conductive barrier wall;
a coolant manifold, disposed in the back end of the storage drawer chassis, that distributes coolant among a plurality of coolant channels extending within the thermally-conductive barrier walls to cool the one or more hard-disk-based storage drives, wherein:
the coolant channels form a serpentine path within the thermally-conductive barrier walls; and
heat generated by the hard-disk-based storage drives is transferred to the coolant channels extending within the thermally-conductive barrier walls of the storage drawer chassis;
an inlet mechanism adapted to receive the coolant into the coolant manifold of the storage drawer chassis; and
an outlet mechanism adapted to permit the coolant to exit the storage drawer chassis for thermal processing.
2. The apparatus of claim 1, further comprising a plurality of slot guides extending within the storage bays, each of the slot guides defining a slot sized to receive a storage drive.
3. The apparatus of claim 1, further comprising a barrier pivot that secures at least one thermally-conductive barrier wall of the thermally-conductive barrier walls to the storage drawer chassis, the barrier pivot permitting the at least one thermally-conductive barrier wall to rotate upon insertion of an initial hard-disk-based storage drive of the one or more hard-disk-based storage drives to increase contact between the at least one thermally-conductive barrier wall and a sidewall of the initial hard-disk-based storage drive.
4. The apparatus of claim 1, wherein
the opposing orientations of the ramps, protruding from the surface of the at least one thermally-conductive barrier wall, and the corresponding ramps, protruding from the surface of the sidewall, increase contact between the at least one thermally-conductive barrier wall and the sidewall.
5. The apparatus of claim 1, wherein:
at least one of the hard-disk-based storage drives comprises:
a storage drive housing;
a hard disk;
a controller; and
a heat exchanger; and
the heat exchanger comprises a heat pipe extending longitudinally within the storage drive housing such that the heat pipe is positioned proximate a wall of one of the thermally-conductive barriers that defines a first storage bay of the storage drawer chassis.
6. The apparatus of claim 5, wherein the heat exchanger further comprises an additional heat pipe extending longitudinally within the storage drive such that the additional heat pipe is positioned proximate an opposing wall of the first storage bay.
7. The apparatus of claim 1, wherein:
the inlet mechanism and outlet mechanism comprise connectors configured to form a connection with a flexible inlet hose and a connection with a flexible outlet hose, respectively; and
the connections are resistant to coolant leakage.
8. The apparatus of claim 7, wherein:
the storage drawer chassis further comprises a rail system configured to attach to a rack chassis in a sliding connection such that the storage drawer chassis is displaceable relative to the chassis to permit access to the storage bays; and
the flexible inlet hose and the flexible outlet hose flex when the storage drawer chassis is slidingly displaced relative to the chassis.
9. A storage media heat-mitigation system comprising:
a rack chassis configured to receive a plurality of storage drawer chasses;
at least one storage drawer chassis removably inserted into the rack chassis, the storage drawer chassis comprising:
thermally-conductive barrier walls that extend lengthwise from a front end of the storage drawer chassis to a back end of the storage drawer chassis, pairs of the thermally-conductive barrier walls defining storage bays adapted to receive one or more hard-disk-based storage drives, wherein:
the one or more hard-disk based storage drives are inserted into one or more slots defined within the storage bays;
at least one thermally-conductive barrier wall of the thermally-conductive barrier walls comprises a series of ramps protruding from a surface of the at least one thermally-conductive barrier wall; and
a sidewall of a storage device, configured to be inserted into a storage bay defined by the at least one thermally-conductive barrier wall, comprises corresponding ramps, protruding from a surface of the sidewall, with an orientation opposite to the ramps protruding from the surface of the at least one thermally-conductive barrier wall;
a coolant manifold, disposed in the back end of the storage drawer chassis, that distributes coolant among a plurality of coolant channels extending within the thermally-conductive barrier walls to cool the one or more hard-disk-based storage drives, wherein:
the coolant channels form a serpentine path within the thermally-conductive barrier walls; and
heat generated by the hard-disk-based storage drives is transferred to the coolant channels extending within the thermally-conductive barrier walls of the storage drawer chassis;
an inlet mechanism adapted to receive the coolant into the coolant channel of the storage drawer chassis; and an outlet mechanism adapted to permit the coolant to exit the storage drawer chassis for processing.

10. The storage media heat-mitigation system of claim 9, further comprising a plurality of slot guides extending within the storage bays, each of the slot guides defining a slot sized to receive a storage drive.

11. The storage media heat-mitigation system of claim 9, further comprising a barrier pivot that secures at least one thermally-conductive barrier wall of the thermally-conductive barrier walls to the storage drawer chassis, the barrier pivot permitting the at least one thermally-conductive barrier wall to rotate upon insertion of an initial hard-disk-based storage drive of the one or more hard-disk-based storage drives to increase contact between the at least one thermally-conductive barrier wall and a sidewall of the initial hard-disk-based storage drive.

12. The storage media heat-mitigation system of claim 9, wherein:
the inlet mechanism and outlet mechanism comprise connectors configured to form a connection with a flexible inlet hose and a connection with a flexible outlet hose, respectively; and
the connections are resistant to coolant leakage.

13. The storage media heat mitigation system of claim 12, wherein:
the storage drawer chassis further comprises a rail system configured to attach to a rack chassis in a sliding connection such that the storage drawer chassis is displaceable relative to the chassis to permit access to the storage bays; and
the flexible inlet hose and the flexible outlet hose flex when the storage drawer chassis is slidingly displaced relative to the chassis.

14. The storage media heat-mitigation system of claim 9, wherein:
at least one of the hard-disk-based storage drives comprises:
a storage drive housing;
a hard disk;
a controller; and
a heat exchanger; and
the heat exchanger comprises a heat pipe extending longitudinally within the storage drive housing such that the heat pipe is positioned proximate a wall of one of the thermally-conductive barriers that defines a first storage bay of the storage drawer chassis.

15. The storage media heat-mitigation system of claim 14, wherein the heat exchanger further comprises an additional heat pipe extending longitudinally within the storage drive such that the additional heat pipe is positioned proximate an opposing wall of the first storage bay.

16. The storage media heat-mitigation system of claim 9, wherein the opposing orientations of the ramps, protruding from the surface of the at least one thermally-conductive barrier wall, and the corresponding ramps, protruding from the surface of the sidewall, increase contact between the at least one thermally-conductive barrier wall and the sidewall.

17. A method comprising:
connecting a storage drawer chassis to a coolant processing system, wherein:
the storage drawer chassis comprises thermally-conductive barrier walls that extend lengthwise from a front end of the storage drawer chassis to a back end of the storage drawer chassis, pairs of the thermally-conductive barrier walls defining storage bays adapted to receive one or more hard-disk-based storage drives into one or more slots defined within the storage bays;
the coolant processing system is configured to distribute coolant among a plurality of coolant channels extending within the thermally-conductive barrier walls to cool the one or more hard-disk-based storage drives via heat generated by the hard-disk-based storage drives transferring to the coolant channels, the coolant channels forming a serpentine path within the thermally-conductive barrier walls;
the storage drawer chassis further comprises (1) an inlet mechanism adapted to receive the coolant into the coolant channels of the storage drawer chassis and (2) an outlet mechanism adapted to permit the coolant to exit the storage drawer chassis for processing;
at least one thermally-conductive barrier wall of the thermally-conductive barrier walls comprises a series of ramps protruding from a surface of the at least one thermally-conductive barrier wall; and
a sidewall of a storage device, configured to be inserted into a storage bay defined by the at least one thermally-conductive barrier wall, comprises corresponding ramps, protruding from a surface of the sidewall, with an orientation opposite to the ramps protruding from the surface of the at least one thermally-conductive barrier wall; and
circulating the coolant through the coolant channels.

18. The method of claim 17, wherein the coolant comprises at least one of a liquid or a gas.

* * * * *